(12) United States Patent
Ecker et al.

(10) Patent No.: US 8,350,577 B1
(45) Date of Patent: Jan. 8, 2013

(54) METHOD AND APPARATUS FOR CALIBRATION OF PULSE-WIDTH BASED MEASUREMENT

(75) Inventors: Reuven Ecker, Haifa (IL); Shimon Avitan, Kiryat Ata (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 450 days.

(21) Appl. No.: 12/762,820

(22) Filed: Apr. 19, 2010

(51) Int. Cl.
*G01R 35/00* (2006.01)

(52) U.S. Cl. ........................................ 324/601

(58) Field of Classification Search ............... None
See application file for complete search history.

(56) References Cited

U.S. PATENT DOCUMENTS

| | | | | |
|---|---|---|---|---|
| 3,133,189 | A * | 5/1964 | Bagley et al. | 324/76.64 |
| 6,819,117 | B2 * | 11/2004 | Wilsher | 324/601 |
| 2006/0116845 | A1 | 6/2006 | Pan | |
| 2008/0069176 | A1 | 3/2008 | Pertijs et al. | |

OTHER PUBLICATIONS

Notice of Allowance issued in U.S. Appl. No. 11/874,595; Mar. 29, 2010.
U.S. Appl. No. 11/874,595, filed Oct. 18, 2007.

* cited by examiner

*Primary Examiner* — Paresh Patel

(57) ABSTRACT

Aspects of the disclosure provide a method for calibrating pulse-width based measurement. The method includes generating a sloped time varying signal having a voltage level that varies with time, and generating a calibration pulse having a first calibration edge and a second calibration edge. The first calibration edge corresponds to a first calibration time that the sloped time varying signal has a first reference voltage, and the second calibration edge corresponds to a second calibration time that the sloped time varying signal has a second reference voltage. Further, the method includes modifying a parameter that governs a slope of the sloped time varying signal to calibrate the slope, such that a calibration pulse width of the calibration pulse is substantially equivalent to a reference time length. Then, the method includes performing pulse-width based measurement based on the calibrated slope.

20 Claims, 7 Drawing Sheets

METHOD AND APPARATUS FOR CALIBRATION OF PULSE-WIDTH BASED MEASUREMENT

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Pulses can be used to measure various operational parameters of an integrated circuit (IC). In an example, an IC generates a pulse having a pulse width as a function of a chip temperature for measuring. The pulse width is then converted to a digital value representing the chip temperature. However, various variation sources, such as process variation, power supply variation, and the like, can affect the pulse width, and thus affect the accuracy of pulse-width based measurement.

SUMMARY

Aspects of the disclosure can provide a method for calibrating pulse-width based measurement. The method includes generating a sloped time varying signal having a voltage level that varies with time, and generating a calibration pulse having a first calibration edge and a second calibration edge. The first calibration edge corresponds to a first calibration time that the sloped time varying signal has a first reference voltage, and the second calibration edge corresponds to a second calibration time that the sloped time varying signal has a second reference voltage. Further, the method includes modifying a parameter that governs a slope of the sloped time varying signal, such that a calibration pulse width of the calibration pulse is substantially equivalent to a reference time length. In addition, the method includes generating the first reference voltage and the second reference voltage based on a band-gap voltage.

In an embodiment, to generate the sloped time varying signal having the voltage level that varies with time, the method includes charging/discharging a capacitor to vary a voltage on the capacitor to generate the sloped time varying signal. To modify the parameter that governs the slope of the sloped time varying signal, the method includes switching on/off at least one current source to modify a charging/discharging current to the capacitor.

Further, to determine the reference time length, the method includes receiving an external clock signal, and determining the reference time length based on the external clock signal.

According to an embodiment of the disclosure, the method includes averaging at least two calibration pulses that are affected by mismatches in an opposite manner to determine the calibration pulse width in order to cancel the mismatches. In an example, the method includes generating a first calibration pulse by comparing the sloped time varying signal with the first reference voltage using a first comparator and comparing the sloped time varying signal with the second reference voltage using a second comparator. Further, the method includes generating a second calibration pulse by comparing the sloped time varying signal with the first reference voltage using the second comparator, and comparing the sloped time varying signal with the second reference voltage using the first comparator. Then, the method includes averaging at least the first calibration pulse and the second calibration pulse to determine the calibration pulse width in order to cancel mismatches of the first comparator and the second comparator.

Further, the method includes maintaining the slope of the sloped time varying signal when the calibration pulse width is substantially equivalent to the reference time length, and performing measurement based on the maintained slope. Specifically, a measurement method can first calibrate the slope of the sloped time varying signal using the method for calibrating pulse-width based measurement. Further, the measurement method includes generating the sloped time varying signal that varies with time having the calibrated slope, generating a measurement signal having a voltage level that varies with a physical parameter to be measured, and generating a measurement pulse having a first measurement edge and a second measurement edge. The first measurement edge corresponds to a first measurement time that the sloped time varying signal has the voltage level of the measurement signal, and a second measurement edge corresponds to a second measurement time that the sloped time varying signal has the second reference voltage. A width of the measurement pulse corresponds to a magnitude of the physical parameter.

Aspects of the disclosure can provide an apparatus. The apparatus includes a signal generator configured to generate a first reference voltage, a second reference voltage, and a sloped time varying signal having a voltage level that varies with time. Further, the apparatus includes a pulse generator configured to generate a calibration pulse having a first calibration edge and a second calibration edge. The first calibration edge corresponds to a first calibration time that the sloped time varying signal has the first reference voltage, and the second calibration edge corresponds to a second calibration time that the sloped time varying signal has the second reference voltage. Then, the apparatus includes a calibration controller configured to control the signal generator to modify a parameter that governs a slope of the sloped time varying signal, such that a calibration pulse width of the calibration pulse is substantially equivalent to a reference time length.

In an embodiment, the signal generator includes a band-gap voltage generator configured to generate a band-gap voltage reference, and a scaling module configured to scale the band-gap voltage reference to generate the first reference voltage and the second reference voltage. Further, the signal generator includes a capacitor, and a current sink having a plurality of switchable current sources. The current sink is configured to provide a current to charge/discharge the capacitor to vary a voltage on the capacitor to generate the sloped time varying signal. The calibration controller is configured to switch on/off at least one switchable current source to modify the charging/discharging current to the capacitor.

In addition, the calibration controller is configured to receive an external clock signal, and determine the reference time length based on the external clock signal.

In an embodiment, the pulse generator includes a first comparator and a second comparator. The calibration controller is configured to control the pulse generator to generate a first calibration pulse by comparing the sloped time varying signal with the first reference voltage using the first comparator and comparing the sloped time varying signal with the second reference voltage using the second comparator. Further, the calibration controller controls the pulse generator to generate a second calibration pulse by comparing the sloped time varying signal with the first reference voltage using the second comparator, and comparing the sloped time varying signal with the second reference voltage using the first comparator. Then, the calibration controller averages at least the first calibration pulse and the second calibration pulse to determine the calibration pulse width.

Further, the calibration controller is configured to maintain the slope of the sloped time varying signal when the calibration pulse width is equivalent to the reference time length. Thus, the apparatus performs pulse-width based measurement based on the maintained slope. Specifically, the apparatus includes a physical parameter measurement module configured to generate a measurement signal having a voltage level that varies with a physical parameter for measuring. Further, the signal generator is configured to generate the sloped time varying signal that varies with time according to the maintained slope, and the pulse generator is configured to generate a measurement pulse having a first measurement edge and a second measurement edge. The first measurement edge corresponds to a first measurement time that the sloped time varying signal has the voltage level of the measurement signal, and a second measurement edge corresponds to a second measurement time that the sloped time varying signal has the second reference voltage. A width of the measurement pulse corresponds to a magnitude of the physical parameter.

Aspects of the disclosure can also provide an apparatus that can be coupled to a calibration controller for calibrating pulse-width based measurement. The apparatus includes a signal generator configured to generate a first reference voltage, a second reference voltage, and a sloped time varying signal having a voltage level that varies with time. Further, the apparatus includes a pulse generator configured to generate a calibration pulse having a first calibration edge and a second calibration edge. The first calibration edge corresponds to a first calibration time that the sloped time varying signal has the first reference voltage, and the second calibration edge corresponds to a second calibration time that the sloped time varying signal has the second reference voltage. Then, the apparatus includes a calibration interface configured to receive a calibration control signal that controls the signal generator to modify a parameter that governs a slope of the sloped time varying signal, such that a calibration pulse width of the calibration pulse is substantially equivalent to a reference time length.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
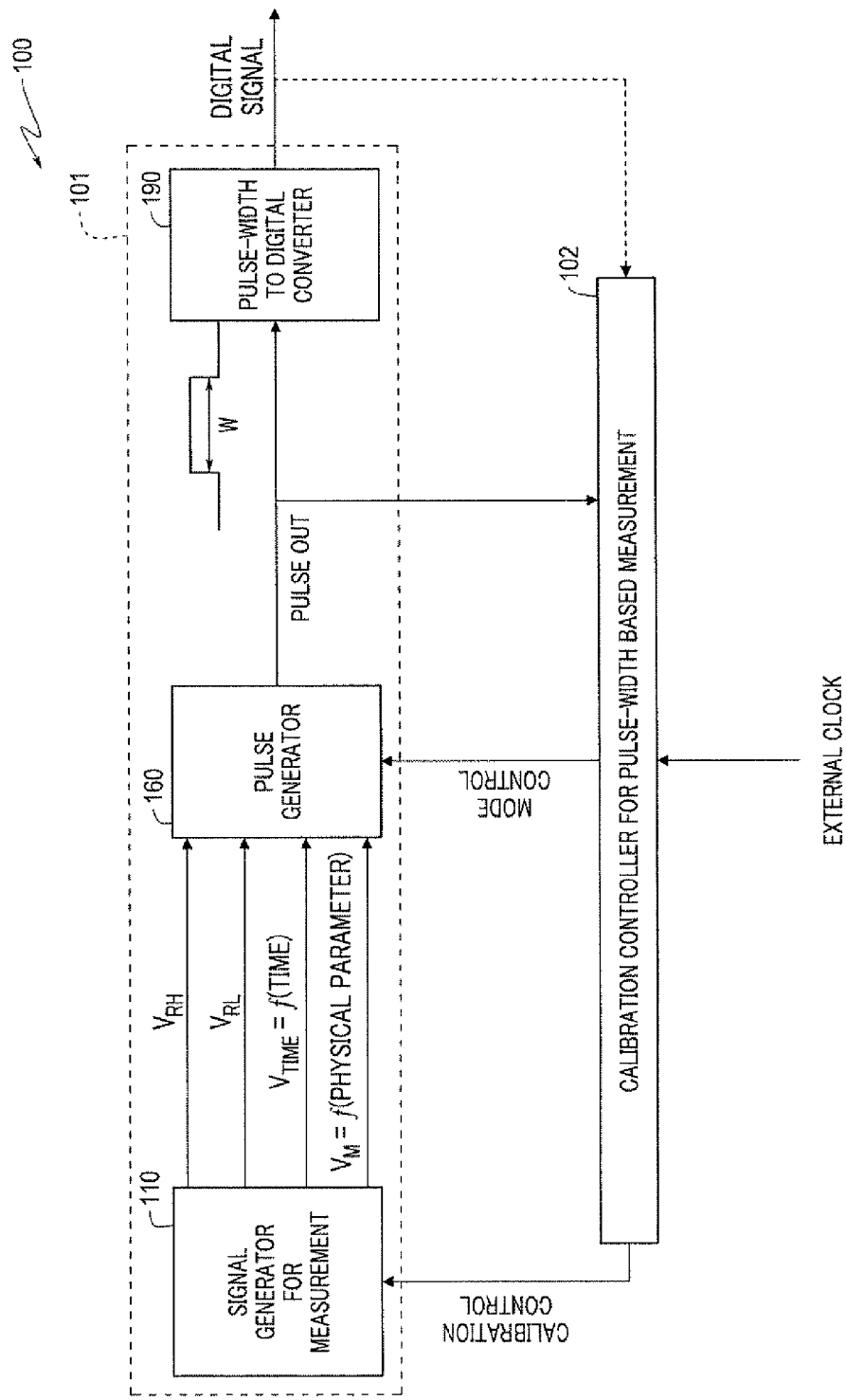
FIG. 1 shows a block diagram of a calibration system example 100 according to an embodiment of the disclosure.

FIG. 1 shows a block diagram of a calibration system example 100 according to an embodiment of the disclosure. The calibration system 100 includes a pulse-width based measurement unit 101 and a calibration controller 102. In an embodiment, the pulse-width based measurement unit 101 includes a signal generator 110 for generating voltage signals, a pulse generator 160 for constructing a pulse based on the voltage signals, and a pulse-width to digital converter 190. These elements are coupled together as shown in FIG. 1. In an example, the pulse-width based measurement unit 101 is configured as a temperature measuring circuit, such as disclosed in Applicant's co-pending application Ser. No. 11/874, 595, filed Oct. 18, 2007, and assigned to Marvel, which is incorporated herein by reference in its entirety.

The signal generator 110 generates various voltage signals for measurement and calibration purposes. In an example, the signal generator 110 generates a pair of reference signals $V_{RH}$ and $V_{RL}$, a sloped time varying signal $V_{TIME}$ and a measurement signal $V_M$ for measuring a physical parameter. The measurement signal $V_M$ has a voltage level that varies with a target physical parameter for measuring, such as a temperature, a voltage, and the like. The sloped time varying signal $V_{TIME}$ is a sloped signal and is configured to have a voltage level that varies with time.

In an embodiment, reference signals $V_{RH}$ and $V_{RL}$ are substantially constant, and relatively independent of various variation sources, such as process variation, temperature variation, supply voltage variation, and the like that may affect an IC chip. In an embodiment, $V_{RH}$ and $V_{RL}$ are provided from an external voltage source. In another embodiment, $V_{RH}$ and $V_{RL}$ are generated on an IC chip based on a band-gap voltage that generally does not change with process, temperature, supply voltage and the like. However, the reference voltages $V_{RH}$ and $V_{RL}$ may differ slightly from chip to chip, and can affect measurement accuracy.

In an embodiment, $V_{TIME}$ is a sloped signal that in an embodiment varies substantially linearly with time. In an example, $V_{TIME}$ is generated based on charging/discharging a capacitor. $V_{TIME}$ intersects other signals to generate pulses, which in an embodiment are relied upon to measure a physical parameter, such as temperature. It is noted that the pulse width corresponds to time. It is also noted that the pulse width depends on a slope of $V_{TIME}$, and thus the slope of $V_{TIME}$ affects measurement accuracy. In an example, the slope of $V_{TIME}$ is affected by process variation, and thus $V_{TIME}$ signals generated on different integrated circuit (IC) chips have different slopes. In another example, the slope of $V_{TIME}$ can be affected by temperature, and thus a same IC chip has different slopes under different temperatures. The slope variation affects measurement accuracy. According to an embodiment of the disclosure, the slope of $V_{TIME}$ is calibrated during a calibration process to compensate for various variations in process, temperature and the like, and to improve measurement accuracy.

The pulse generator 160 receives the various signals from the signal generator 110, and generates a pulse based on the various signals. According to an embodiment of the disclosure, the pulse generator 160 has multiple operation modes. In different operation modes, the pulse generator 160 generates the pulse based on different signals. In an example, the pulse generator 160 has a calibration mode, and a measurement mode. When the pulse generator 160 is configured in the calibration mode, the pulse generator 160 generates a pulse based on $V_{RH}$, $V_{RL}$ and $V_{TIME}$ that is used for calibrating the pulse generator. When the pulse generator 160 is configured in the measurement mode, the pulse generator 160 generates a measurement pulse based on $V_M$, $V_{RL}$ and $V_{TIME}$ that is used for measuring a physical parameter such as, but not only, temperature.

The pulse-width to digital converter 190 converts the pulse width of the generated pulse into digital values. It is noted that pulse-width to digital converter 190 can be configured to convert the pulse widths of all the generated pulses to digital values, or can be configured to convert the pulse widths of the measurement pulses to digital values. In an embodiment, the pulse-width to digital converter 190 includes a counter to count a number of clock cycles of a reference clock. The counter is enabled by a pulse, and thus the counted number of clock cycles corresponds to the pulse width of the pulse.

The calibration controller 102 controls a calibration process to determine a slope of $V_{TIME}$ to compensate for various variations in order to improve measurement accuracy. During operation, for example, the calibration controller 102 provides a mode control signal to the pulse generator 160 to set a mode of operation. When in calibration mode, the pulse generator 160 is configured to generate a calibration pulse based on $V_{TIME}$ and the reference signals $V_{RH}$ and $V_{RL}$. Further, based on feedback from the pulse generator 160, the calibration controller 102 provides calibration control signals to the signal generator 110 to adjust the slope of $V_{TIME}$ in order to change a calibration pulse width of the calibration pulse. The calibration controller 102 compares the calibration pulse width with a reference time length. In an embodiment, the calibration controller 102 receives the calibration pulse from the pulse generator 160, and determines the calibration pulse width based on the received calibration pulse. In another embodiment, the calibration controller 102 receives a digital value representing the calibration pulse width from the pulse-width to digital converter 190. When the calibration pulse width matches the reference time length, the calibration controller 102 maintains the calibrated slope of $V_{TIME}$, and configures the pulse generator 160 into the measurement mode to perform measurement based on the calibrated slope of $V_{TIME}$.

In accordance with an embodiment, the reference time length has a relatively high accuracy. In an embodiment, the calibration controller 102 receives an external clock generated by a crystal oscillator or received from a stable external clock source. The external clock is substantially independent of IC process variation, chip temperature variation, chip supply voltage variation, and the like, and has a relatively high accuracy. Based on the external clock, the calibration controller 102 determines the reference time length.

In an embodiment, the pulse-width based measurement unit 101 is disposed on an IC chip, and the calibration controller 102 is external to the IC chip. The IC chip includes a calibration interface that couples the calibration controller 102 to the IC chip at a calibration time to calibrate the slope of $V_{TIME}$. The calibrated slope of $V_{TIME}$ can be maintained after the calibration. In another embodiment, the pulse-width based measurement unit 101 and the calibration controller 102 are on a same IC chip. The calibration controller 102 can start a calibration process to calibrate the slope of $V_{TIME}$ at any suitably time.

Figure 2:
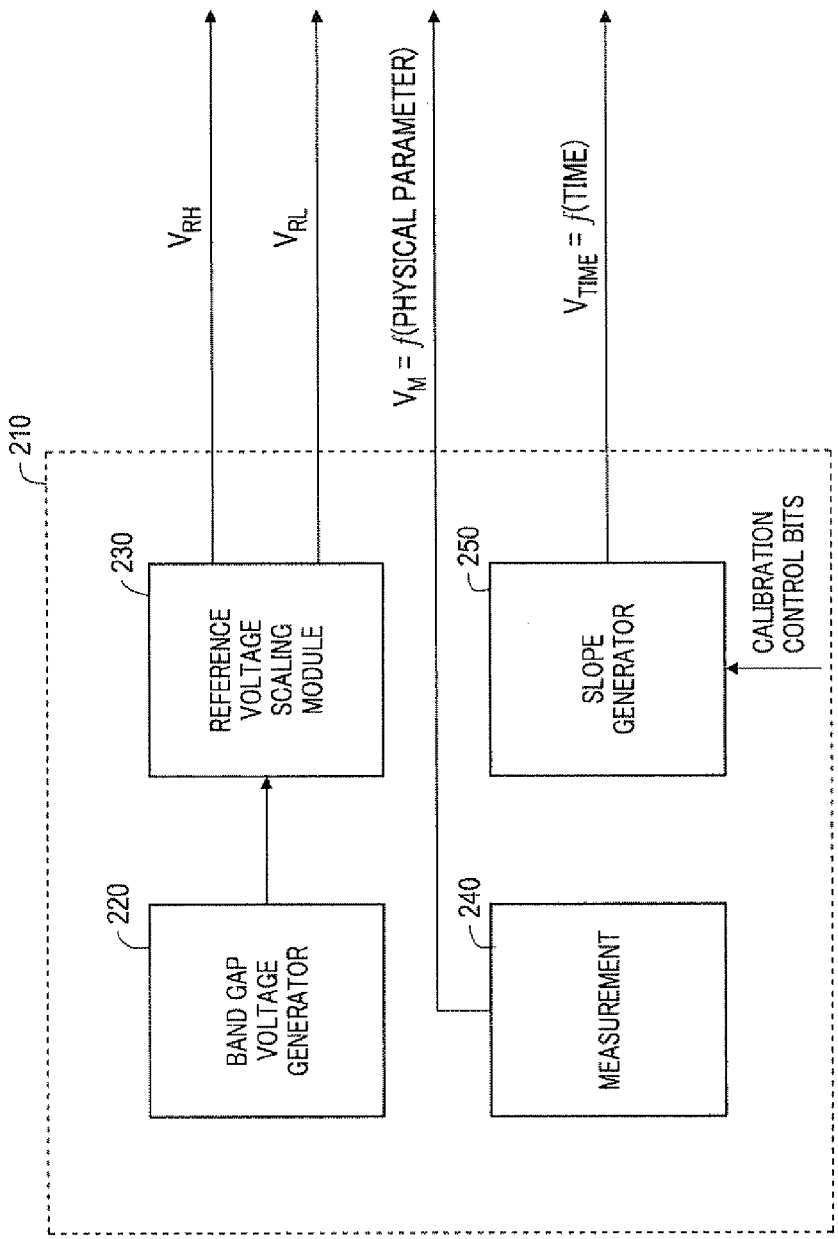
FIG. 2 shows a block diagram of a signal generator example 210 according to an embodiment of the disclosure.

FIG. 2 shows a block diagram of a signal generator example 210 according to an embodiment of the disclosure. The signal generator 210 seen in FIG. 2 includes a band-gap voltage generator 220, a reference voltage scaling module 230, a measurement module 240, and a slope generator 250.

The band-gap voltage generator 220 generates a band-gap voltage that is substantially independent of process variation, temperature variation, supply voltage variation, and the like. The reference voltage scaling module 230 receives the band-gap voltage, and generates the reference voltages $V_{RL}$ and $V_{RH}$. The measurement unit 240 generates the measurement signal $V_M$ that is a function of a physical parameter for measuring. The slope generator 250 generates the time varying signal $V_{TIME}$. The slope of $V_{TIME}$ can be adjusted based on calibration control signals, such as calibration control bits.

Figure 3:
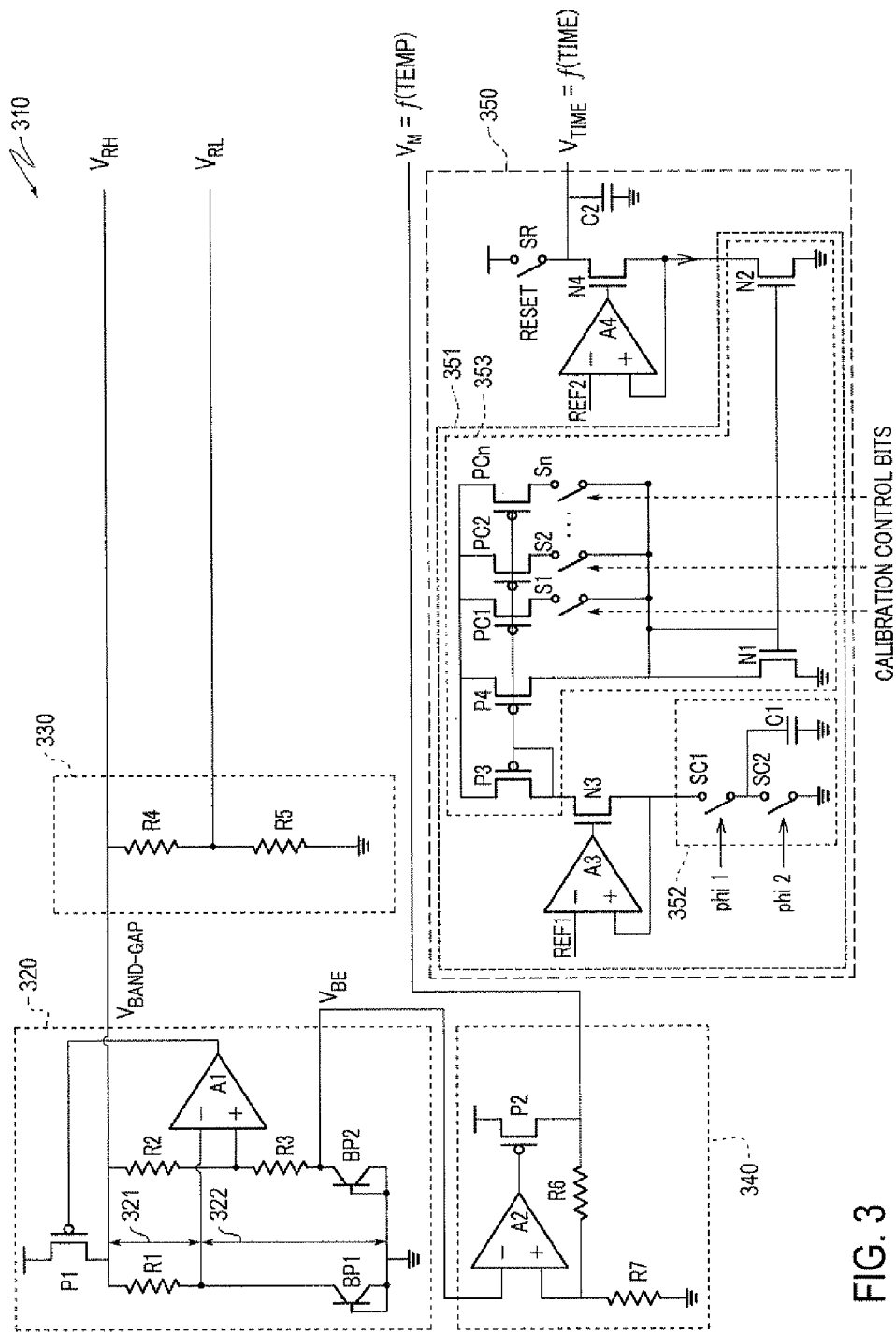
FIG. 3 shows a schematic diagram of a signal generator example 310 according to an embodiment of the disclosure.

FIG. 3 shows a schematic diagram of a signal generator 310 according to an embodiment of the disclosure. The signal generator 310 includes a band-gap voltage generator 320, a reference voltage scaling module 330, a measurement multiplier unit 340, and a slope generator 350. In an embodiment, these elements are coupled together as shown in FIG. 3.

The band-gap voltage generator 320 can include any suitable circuit to generate a band-gap voltage. In the FIG. 3 example, the band-gap voltage generator 320 includes a p-type metal-oxide-semiconductor (PMOS) transistor P1, an operational amplifier A1, three resistors R1-R3, two bipolar transistors BP1 and BP2. These elements are coupled together as shown in FIG. 3. The band-gap voltage generator 320 generates a band-gap voltage $V_{BAND-GAP}$ as a reference source, and an emitter-base voltage $V_{BE}$ for temperature measurement. $V_{BAND-GAP}$ includes two voltage components—a first voltage component 321 across resistor R1, and a second voltage component 322 that is an emitter-base voltage of BP1.

The second voltage component 322 has a negative temperature coefficient. The first voltage component 321 has a positive temperature coefficient, and can be represented by $\alpha T$, where $\alpha$ is a positive temperature coefficient, and T is the absolute temperature. The positive temperature coefficient $\alpha$ depends on a resistor ratio of R2 and R3, and a size ratio of BP1 and BP2. In an example, the resistor ratio of R2 and R3 and the size ratio of BP1 and BP2 are suitably adjusted, such that the positive temperature coefficient of the first voltage component 321 cancels the negative temperature coefficient of the second voltage component 322. Therefore, in an embodiment, the band-gap voltage $V_{BAND-GAP}$ is substantially independent of temperature.

Further, in an embodiment, the band-gap voltage generator 320 is suitably configured to reduce band-gap voltage variations due to process. In an example, the operational amplifier A1 is implemented using native devices, such as native transistors, and the like. Parameters of the native devices, such as thresholds, have reduced dependency on process. For example, a threshold of a native transistor is substantially independent of implantation process. In addition, $V_{BAND-GAP}$ is generated based on configuring ratios of semiconductor device pairs. The ratios of semiconductor device pairs are generally controlled by design, and have a reduced dependency on process.

The reference voltage scaling module 330 receives $V_{BAND-GAP}$, and generates the reference voltages $V_{RL}$ and $V_{RH}$ based on $V_{BAND-GAP}$. The reference voltage scaling module 330 can use any suitable circuit to scale $V_{BAND-GAP}$. In the FIG. 3 example, the reference voltage scaling module 330 includes two resistors R4 and R5 that form a voltage divider. $V_{RH}$ is substantially equivalent to $V_{BAND-GAP}$, and $V_{RL}$ is a fraction of $V_{RH}$. In an example, R4 equals R5, and thus $V_{RL}$ is one half of $V_{RH}$.

The measurement multiplier unit 340 receives the emitter-base voltage $V_{BE}$ from the band-gap voltage generator 320. The emitter-base voltage $V_{BE}$ has a negative temperature coefficient, and can be used to measure temperature. The measurement multiplier unit 340 can include any suitably circuit to multiple $V_{BE}$ to a desired dynamic range. In the FIG. 3 example, the measurement multiplier unit 340 includes an operational amplifier A2, a PMOS transistor P2, and two resistors R6 and R7 coupled together as shown in FIG. 3. The measurement multiplier unit 340 has a gain based on a ratio of R6 to R7.

The slope generator 350 generates the sloped time varying signal $V_{TIME}$. In addition, the slope generator 350 adjusts the slope of $V_{TIME}$ based on calibration control bits. The slope generator 350 can include any suitable circuit to generate $V_{TIME}$. In the FIG. 3 example, the slope generator 350 charges or discharges a capacitor based on a scalable current sink.

In the embodiment seen in FIG. 3, the slope generator 350 includes a reset switch SR, a capacitor C2, and a current sink 351. The slope generator 350 generates $V_{TIME}$ based on two phases (a reset phase and an integration phase) controlled by the reset switch SR. When the reset switch SR is closed, the slope generator 350 is configured in the reset phase. In the reset phase, the capacitor C2 is charged quickly by the supply voltage, and thus $V_{TIME}$ is high. When the reset switch SR is open, the slope generator 350 is configured in the integration phase. In the integration phase, a current driven by the current sink 351 discharges the capacitor C2, thus $V_{TIME}$ is reduced. Ideally, when the current driven by the current sink 351 is substantially constant during the integration phase, $V_{TIME}$ decreases substantially linearly with time. However, $V_{TIME}$ can be non-linear due to reasons like initialization effect, or boundary effect, for example, at a beginning of discharging, or when $V_{TIME}$ is quite low. Linearity provides high predictability, which can improve efficiency.

In the FIG. 3 example, the current sink 351 includes a switch capacitor circuit 352 and a current mirror circuit 353. The switch capacitor circuit 352 includes two switches SC1 and SC2, and a capacitor C1. The two switches SC1 and SC2 are controlled by non-overlapping signals phi1 and phi2 to turn on alternatively. Thus, the capacitor C1 is charged and discharged alternatively. An average current during a cycle is determined by a reference voltage REF1 and the capacitance of capacitor C1.

The current mirror circuit 353 copies the current of the switch capacitor circuit 352 with a scale factor, and provides the scaled current as discharging current to discharge the capacitor C2. Thus, in the embodiment of FIG. 3, the slope of $V_{TIME}$ is determined by a ratio of C1 to C2, the reference voltage REF1 and REF2, and the scale factor. In one embodiment, C1 and C2 are matching MOS capacitors, and then the ratio of C1 to C2 is substantially constant, and independent of temperature and process variations. It is also noted that REF1 and REF2 are reference voltages that are generated based on the band-gap voltage $V_{BAND-GAP}$. Therefore, REF1 and REF2 are substantially constant regardless of temperature and process variations.

The current mirror circuit 353 includes NMOS transistors N1 and N2, PMOS transistors P3 and P4, and a plurality of PMOS transistors PC1-PCn coupled with switches S1-Sn. P3, P4 and PC1-PCn form a first current mirror. N1 and N2 form a second current mirror. The first current mirror scales the current of the switch capacitor circuit 352 based on calibration control bits. The second current mirror copies the scaled current to discharge the capacitor C2.

The calibration control bits control the switches S1-Sn to open or close to adjust the scale factor of the first current mirror. When a switch, such as S1, is open, PC1 does not contribute to the first current mirror. When S1 is closed, PC1 contributes to the first current mirror. In an example, P3, P4 and PC1-PCn are of the same size. When all the calibration control bits are relatively low (e.g., corresponding to logic "0"), S1-Sn are open, the scale factor of the first current mirror is one. When one of the calibration control bits is relatively high (e.g., corresponding to logic "1"), and the rest of the calibration control bits are relatively low (e.g., corresponding to logic "0"), the scale factor of the first current mirror is two. When all the calibration control bits are relatively high (e.g., corresponding to logic "1"), the scale factor of the first current mirror is n+1.

It is noted that P3, P4 and PC1-PCn can have different sizes. In an example, width/length (W/L) ratios of PC1-PCn are scaled according to $2^0, 2^1, 2^2, 2^3, \ldots 2^{n-1}$ to increase the adjustment resolution of the scale factor, and further increase the adjustment resolution of the slope of $V_{TIME}$.

Figure 4:
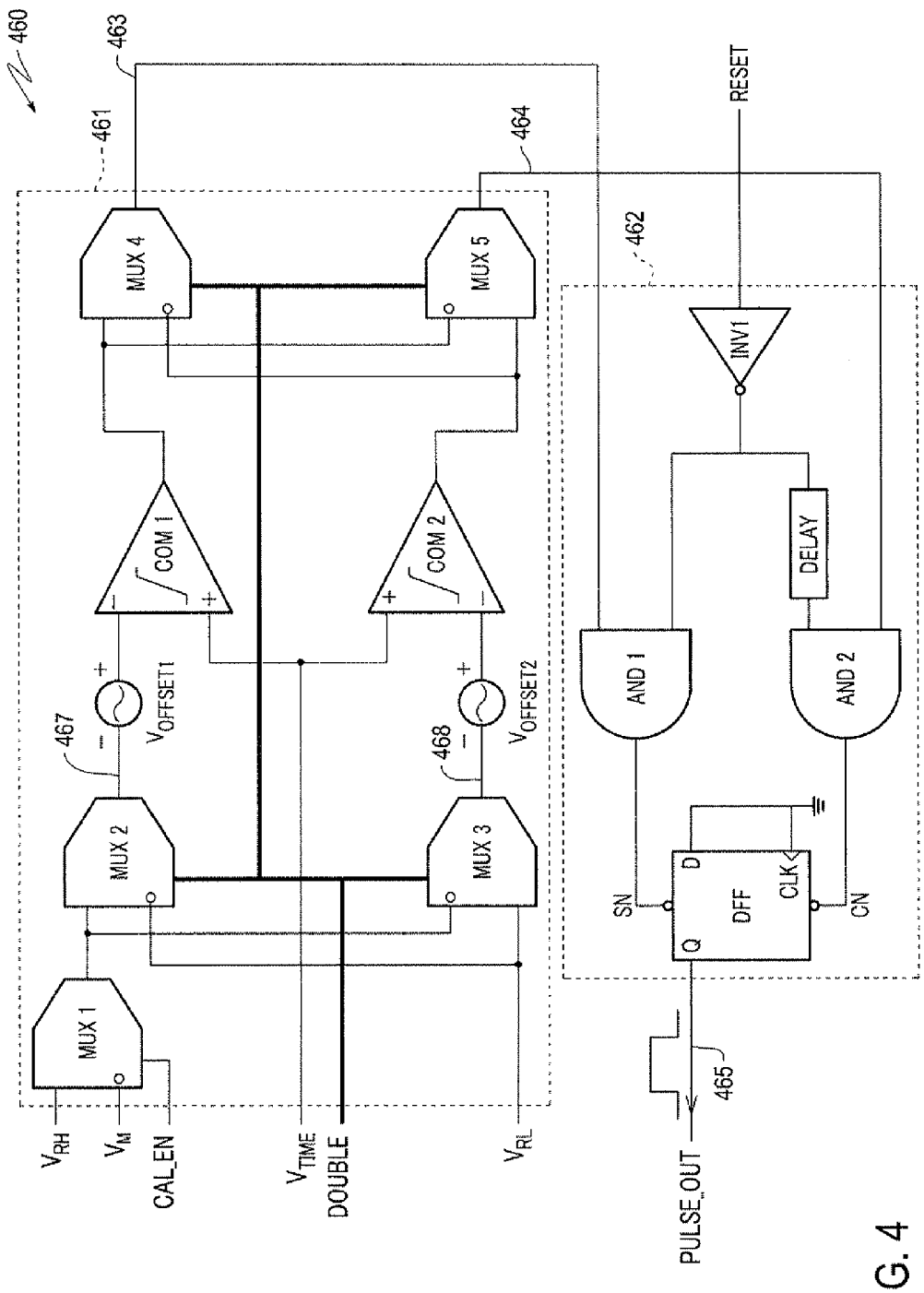
FIG. 4 shows a schematic diagram of a pulse generator 460 according to an embodiment of the disclosure.

FIG. 4 shows a schematic diagram of a pulse generator 460 according to an embodiment of the disclosure. The pulse generator 460 receives two reference voltages $V_{RL}$ and $V_{RH}$, a sloped time varying signal $V_{TIME}$, and a measurement signal, such as $V_M$, corresponding to a physical parameter to be measured. In addition, the pulse generator 460 receives control signals, such as CAL_EN, DOUBLE, RESET, and the like. CAL_EN is used to configure the pulse generator 460 into a calibration mode or a measurement mode. DOUBLE is used to control the pulse generator 460 to cancel offsets. RESET is used to reset the pulse generator 460 for generating a new pulse. The pulse generator 460 includes a first portion 461 and a second portion 462. The first portion 461 compares $V_{TIME}$ with other signals. The second portion 462 generates a pulse based on the comparison.

The first portion 461 can include any suitable circuit to compare $V_{TIME}$ with other signals. In the FIG. 4 example, the first portion 461 includes 5 multiplexers MUX1-MUX5, and two comparators COM1 and COM2. These elements are coupled together as shown in FIG. 4.

The first portion 461 has a calibration mode and a measurement mode, and can be configured in the calibration mode or the measurement mode based on CAL_EN. For example, when CAL_EN is relatively high (e.g., corresponding to logic "1"), the first portion 461 is configured in the calibration mode. In the calibration mode, the first portion 461 generates a first output 463 based on a comparison of $V_{TIME}$ with $V_{RH}$, and generates a second output 464 based on a comparison of $V_{TIME}$ with $V_{RL}$. When CAL_EN is relatively low (e.g., corresponding to logic "0"), the first portion 461 is configured in the measurement mode. In the measurement mode, the first portion 461 generates a first output 463 based on a comparison of $V_{TIME}$ with $V_M$, and generates a second output 464 based on a comparison of $V_{TIME}$ with $V_{RL}$.

The second portion 462 can include any suitable logic circuit to generate PULSE_OUT (465) based on the comparison outputs 463 and 464 from the first portion 461. In the FIG. 4 example, the second portion 462 includes an inverter INV1, a delay module DELAY, two AND gates AND1 and AND2, and a D-flip-flop DFF. In an embodiment, these elements are coupled together as seen in FIG. 4.

During operation, when the second portion 462 receives a reset pulse RESET, the second portion 462 resets PULSE_OUT to relatively low (e.g., corresponding to logic "0"). When both the first output 463 and the second output 464 are relatively high (e.g., corresponding to logic "1"), PULSE_OUT remains relatively low (e.g., corresponding to logic "0"). When the first output 463 switches to relatively low (e.g., corresponding to logic "0"), and the second output 464 remains relatively high (e.g., corresponding to logic "1"), PULSE_OUT switches to relatively high (e.g., corresponding to logic "1"). When the first output 463 remains relatively low (e.g., corresponding to logic "0"), and the second output 464 switches to relatively low (e.g., corresponding to logic "0"), PULSE_OUT switches to relatively low (e.g., corresponding to logic "0"). In the FIG. 4 example, the second portion 462 has an improved robustness to glitches.

In another embodiment, the second portion 462 includes an XOR logic circuit to generate a pulse PULSE_OUT based on the comparison outputs 463 and 464 from the first portion 461.

In the FIG. 4 example, the first portion 461 also receives a control signal DOUBLE. The control signal DOUBLE can be used to average pulse widths in order to compensate for mismatches. In an example, when the first portion 461 is configured in the calibration mode, and DOUBLE is relatively low (e.g., corresponding to logic "0"), the first comparator COM1 compares $V_{TIME}$ with $V_{RL}$, and the second comparator COM2 compares $V_{TIME}$ with $V_{RH}$. Then, based on the comparison, the second portion 462 generates a first calibration pulse. The first comparator COM1 and the second comparator COM2 may have mismatches, and affect calibration pulse width. The mismatch effect can be considered as introducing different offsets $V_{offset1}$ and $V_{offset2}$ at comparator inputs. The mismatches increase or decrease the pulse width of the first calibration pulse.

When DOUBLE is relatively high (e.g., corresponding to logic "1"), and CAL_EN is relatively high (e.g., corresponding to logic "1"), the first comparator COM1 compares $V_{TIME}$ with $V_{RH}$, and the second comparator COM2 compares $V_{TIME}$ with $V_{RL}$. Then, based on the comparison, the second portion 462 generates a second calibration pulse. The mismatches affect the pulse width of the second calibration pulse in an opposite manner to the first calibration pulse. By averaging the pulse widths of the first calibration pulse and the second calibration pulse, the mismatch-induced variations can be cancelled.

It is noted that more than two calibration pulses can be used to calculate an average calibration pulse width. It is also noted that the pulse generator 460 can generate two or more measurement pulses in the measurement mode, and determines an average measurement pulse width based on the two or more measurement pulses.

Figure 5:
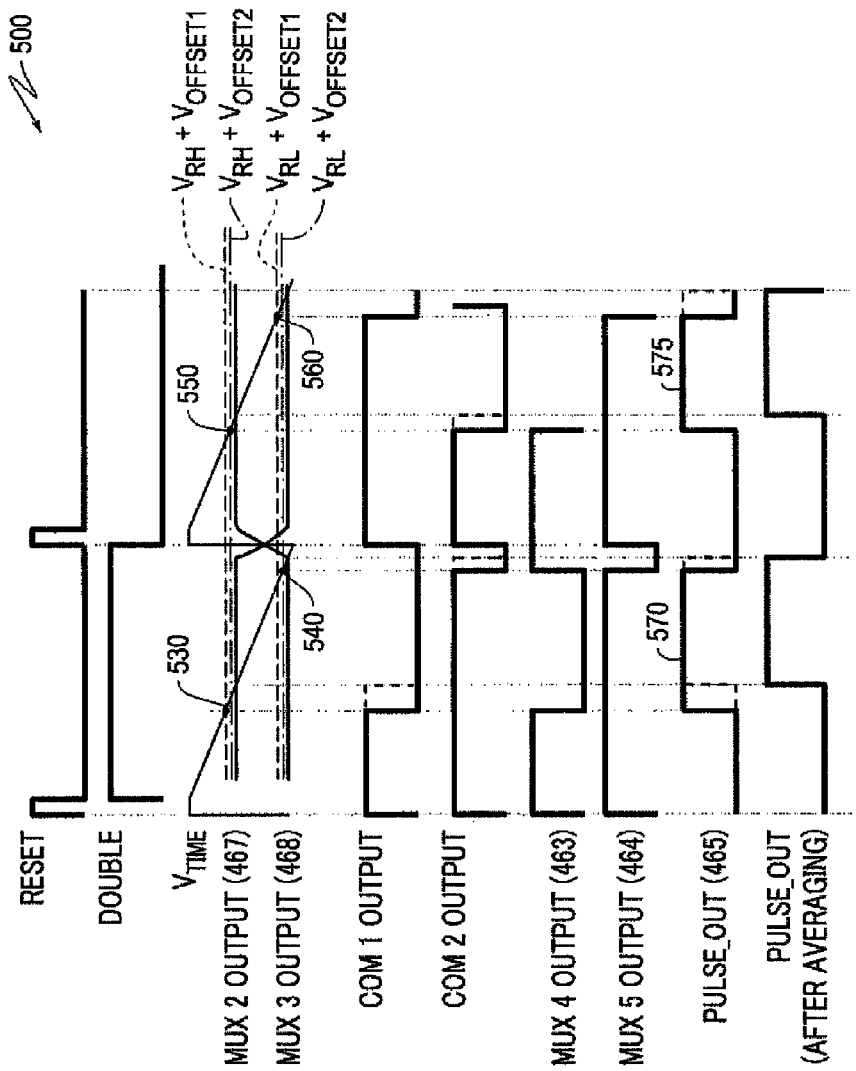
FIG. 5 shows a timing diagram 500 of signals in the pulse generator 460 according to an embodiment of the disclosure.

FIG. 5 shows a timing diagram 500 of signals in the pulse generator 460 according to an embodiment of the disclosure. The timing diagram 500 includes RESET, DOUBLE, MUX2 output (at node 467), MUX3 output (at node 468), MUX4 output (at node 463), MUX5 output (at node 464), PULSE_OUT, and an average of PULSE_OUT.

When DOUBLE is relatively high (e.g., corresponding to logic "1"), PULSE_OUT generates a first pulse 570; and when DOUBLE is relatively low (e.g., corresponding to logic "0"), PULSE_OUT generates a second pulse 575. The first pulse 570 has a first edge corresponding a time 530 that $V_{TIME}$ has a same voltage level as $V_{RH}+V_{offset1}$ and a second edge corresponding to a time 540 that $V_{TIME}$ has a same voltage level as $V_{RL}+V_{offset2}$. When $V_{offset1}$ and $V_{offset2}$ are different due to comparator mismatch, the pulse width of the first pulse 570 is affected by the mismatch. The second pulse 575 has a first edge corresponding to a time 550 that $V_{TIME}$ has a same voltage level as $V_{RH}+V_{offset2}$ and a second edge corresponding a time 560 that $V_{TIME}$ has a same voltage level as $V_{RL}+V_{offset1}$. The pulse width of the second pulse 575 is also affected by the mismatch, but in an opposite manner to the first pulse 570. Thus, an average of the first pulse 570 and the second pulse 575 cancels the mismatch effect.

Figure 6:
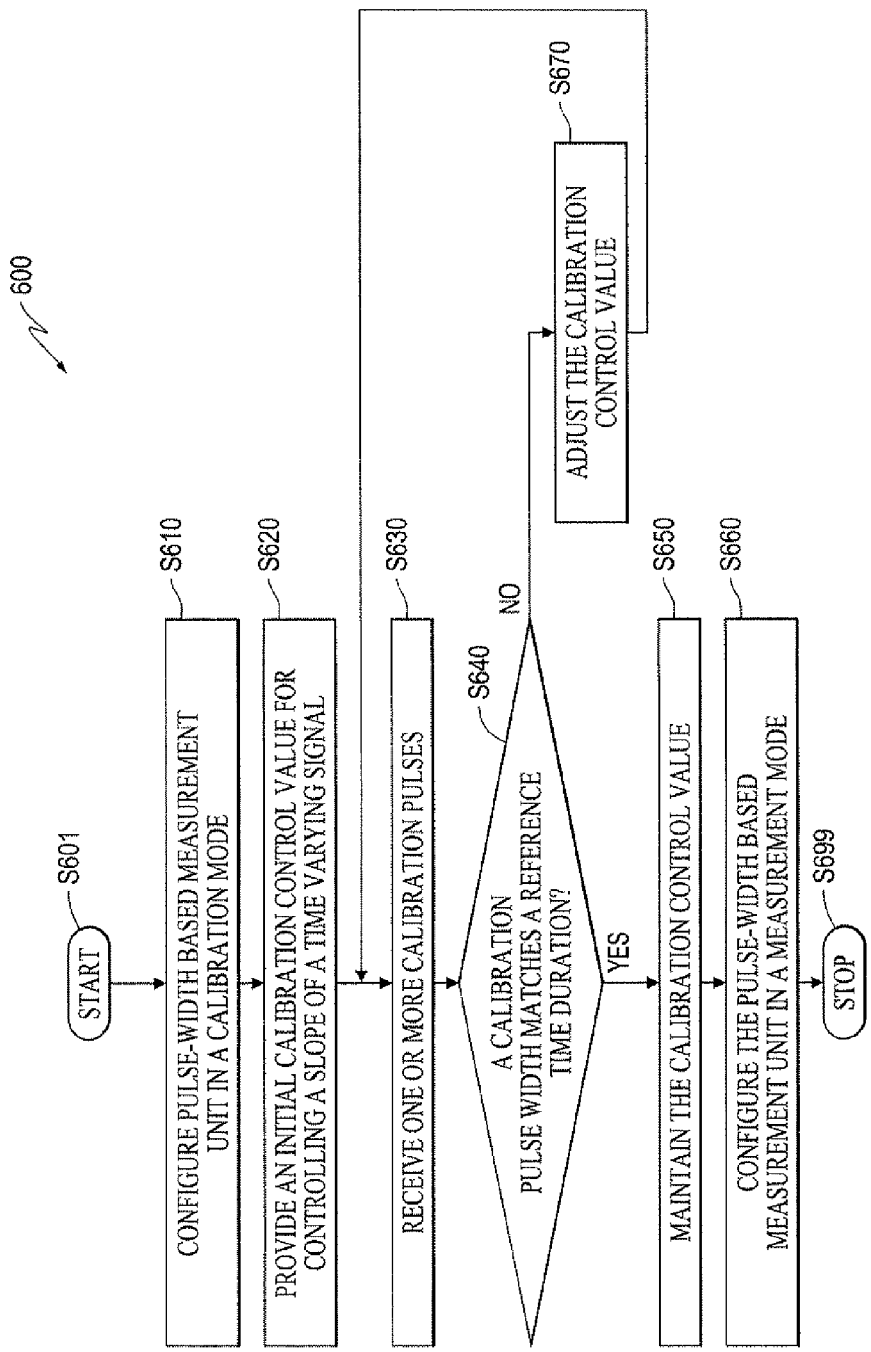
FIG. 6 shows a flow chart outlining a process example 600 for a calibration controller to calibrate a pulse-width based measurement unit according to an embodiment of the disclosure.

FIG. 6 shows a flow chart outlining a process example 600 for a calibration controller, such as the calibration controller 102, to calibrate a pulse-width based measurement unit, such as the pulse-width based measurement unit 101, according to an embodiment of the disclosure. The process starts at S601, and proceeds to S610.

At S610, the calibration controller configures the pulse-width based measurement unit in a calibration mode. The pulse-width based measurement unit then generates pulses based on reference signals. In an example, the calibration controller 102 sends a mode control signal, such as a relatively high CAL_EN (e.g., corresponding to logic "1"), to the pulse generator 460 to configure the pulse generator 460 into the calibration mode. In the calibration mode, the pulse generator 460 generates a calibration pulse based on $V_{TIME}$, $V_{RL}$ and $V_{RH}$.

At S620, the calibration controller provides an initial calibration control value to the pulse-width based measurement unit for controlling a slope of a time varying signal. In an example, the calibration controller 102 sends initial calibration control bits to the slope generator 350 to control the switches S1-Sn (as seen in FIG. 3) to open or close, and results in an initial slope of $V_{TIME}$.

At S630, the calibration controller receives one or more calibration pulses. In an example, the calibration controller 102 receives a first calibration pulse in response to DOUBLE being relatively high (e.g., corresponding to logic "1"), and receives a second calibration pulse in response to DOUBLE being relatively low (e.g., corresponding to logic "0").

At S640, the calibration controller determines whether a calibration pulse width matches a reference time length. In an example, the calibration controller 102 receives an external clock, and determines the reference time length based on the external clock. In an embodiment, the calibration controller compares a pulse width of a calibration pulse with the reference time length. In another embodiment, the calibration controller averages multiple calibration pulses to calculate the calibration pulse width, and compares the calibration pulse width with the reference time length. When the calibration width matches the reference time length, the process proceeds to S650; otherwise, the process proceeds to S670.

At S650, the calibration controller maintains the calibration control value. In an example, the calibration controller stores the calibration control bits in a memory, such as registers, and the like, on the IC chip that includes the pulse-width based measurement unit 101. The stored calibration control bits are used to control the slope of $V_{TIME}$, for example by controlling the switches S1-Sn in the slope generator 350.

At S660, the calibration controller configures the pulse-width based measurement unit in a measurement mode. In an example, the calibration controller 102 sends a mode control signal, such as a relatively low CAL_EN (e.g., corresponding to logic "0"), to the pulse generator 460 to configure the pulse generator 460 into the measurement mode. In the measurement mode, the pulse generator 460 generates a measurement pulse for a physical parameter to be measured based on $V_{TIME}$, $V_M$ and $V_{RL}$. The process proceeds to S699 and terminates.

At S670, the calibration controller adjusts the calibration control value when a calibration pulse width does not match a reference time length. In an example, the calibration controller 102 changes the calibration control bits. In an embodiment, the changed calibration control bits are provided to the slope generator 350 to change the close/open statuses of the switches S1-Sn, and result in a changed slope of $V_{TIME}$. The process then returns to S630.

It is noted that the process 600 can be executed at any suitable time. In an example, the process 600 is executed at a power-up time. In another example, the process 600 is executed when a measured temperature is higher than an upper threshold, or is lower than a bottom threshold.

Figure 7:
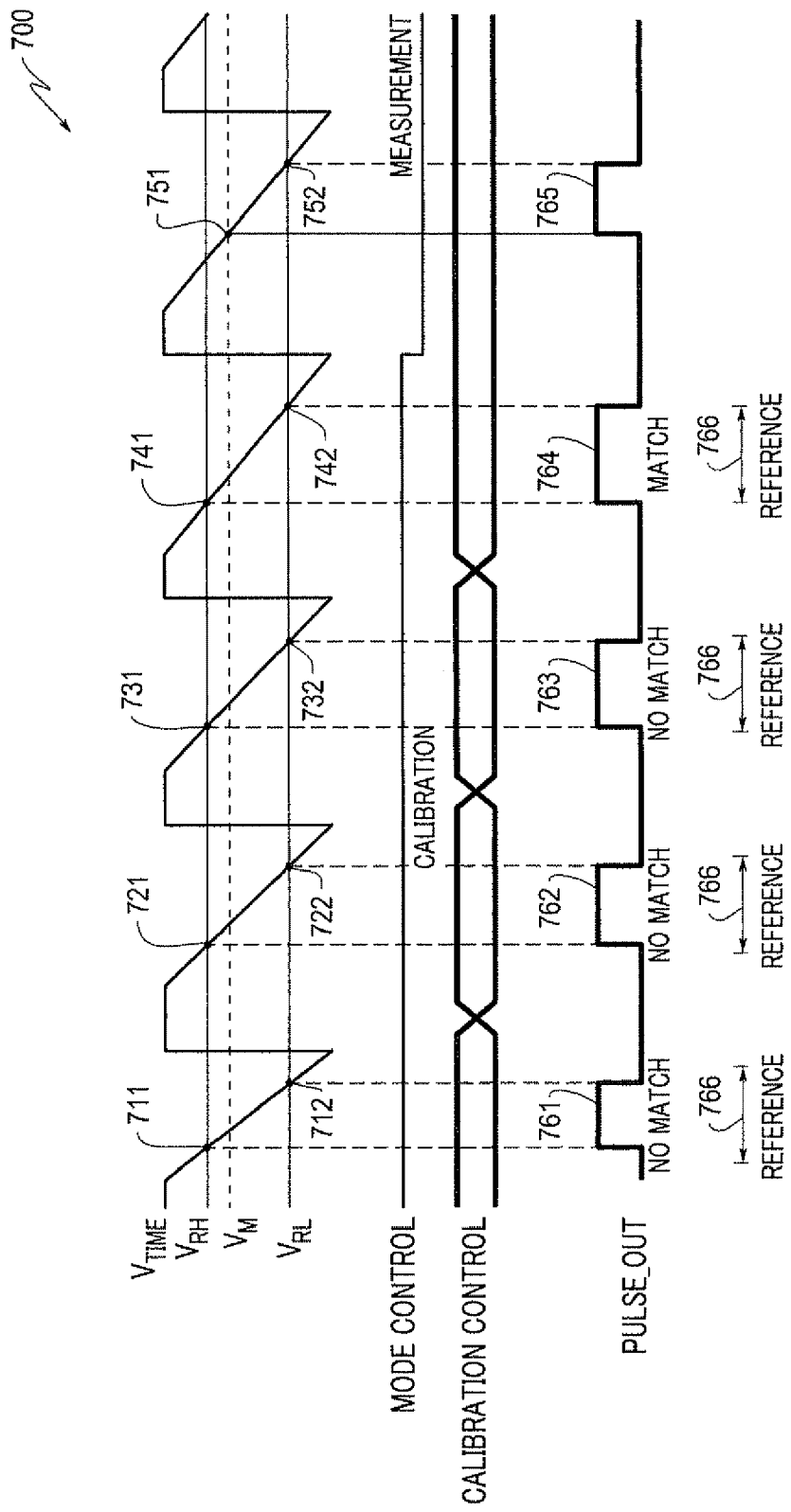
FIG. 7 shows a timing diagram example 700 of calibration and measurement according to an embodiment of the disclosure.

FIG. 7 shows a timing diagram example 700 for a calibration system, such as the calibration system 100, according to an embodiment of the disclosure. The timing diagram 700 includes $V_{TIME}$, $V_{RH}$, $V_{RL}$, $V_M$, a mode control signal, a calibration control signal, and PULSE_OUT.

During operation, the calibration controller 102 provides a relatively high (e.g., corresponding to logic "1") mode control signal to the pulse-width based measurement unit 101 to configure the pulse-width based measurement unit 101 into the calibration mode. Further, the calibration controller 102 provides the calibration control signal to the pulse-width based measurement unit 101 to control the slope of $V_{TIME}$. The pulse-width based measurement unit 101 generates $V_{TIME}$ based on the calibration control signal. Further, the pulse-width based measurement unit 101 generates a calibration pulse 761 based on $V_{TIME}$, $V_{RH}$ and $V_{RL}$. For example, a first edge of the calibration pulse 761 corresponds to a time 711 when $V_{TIME}$ has a same voltage level as $V_{RH}$, and a second edge of the calibration pulse 761 corresponds to a time 712 when $V_{TIME}$ has a same voltage level as $V_{RL}$. When the calibration controller 102 determines that the calibration pulse width does not match a reference time length 766, the calibration controller 102 changes the calibration control value to adjust the slope of $V_{TIME}$. The pulse-width based measurement unit 101 generates a calibration pulse, PULSE_OUT, based on the adjusted slope of $V_{TIME}$, such as calibration pulses 762-764. This process continues until the calibration controller 102 determines that a calibration pulse width matches the reference time length 766, as shown by a calibration pulse 764 in FIG. 7.

Then, the calibration controller 102 provides a relatively low (e.g., corresponding to logic "0") mode control signal to configure the pulse-width based measurement unit 101 into the measurement mode. Further, the calibration controller 102 keeps providing the last calibration control value to the pulse-width based measurement unit 101 to maintain the calibrated slope of $V_{TIME}$. Based on the calibrated slope of $V_{TIME}$, the pulse-width based measurement unit 101 generates a measurement pulse 765. A first edge of the measurement pulse 765 corresponds to a time 751 when $V_{TIME}$ has a same voltage level as $V_M$, and a second edge of the measurement pulse 765 corresponds to a time 752 when $V_{TIME}$ has a same voltage level as $V_{RL}$.

While the invention has been described in conjunction with the specific embodiments thereof that are proposed as examples, it is evident that many alternatives, modifications, and variations will be apparent to those skilled in the art. Accordingly, embodiments of the disclosure as set forth herein are intended to be illustrative, not limiting. There are changes that may be made without departing from the scope of the invention.

What is claimed is:

1. A method for calibration, comprising:
   generating a sloped time varying signal having a voltage level that varies with time;
   generating a calibration pulse having a first calibration edge and a second calibration edge, the first calibration edge corresponding to a first calibration time that the sloped time varying signal has a first reference voltage, and the second calibration edge corresponding to a second calibration time that the sloped time varying signal has a second reference voltage; and
   modifying a parameter that governs a slope of the sloped time varying signal, such that a calibration pulse width of the calibration pulse is substantially equivalent to a reference time length.

2. The method of claim 1, further comprising:
   generating the first reference voltage and the second reference voltage based on a band-gap voltage.

3. The method of claim 1, wherein generating the sloped time varying signal having the voltage level that varies with time, further comprises:
   charging/discharging a capacitor to vary a voltage on the capacitor to generate the sloped time varying signal.

4. The method of claim 3, wherein modifying the parameter that governs the slope of the sloped time varying signal further comprises:
   switching on/off at least one current source to modify a charging/discharging current to the capacitor.

5. The method of claim 1, further comprising:
   receiving an external clock signal; and
   determining the reference time length based on the external clock signal.

6. The method of claim 1, further comprising:
   generating a first calibration pulse by comparing the sloped time varying signal with the first reference voltage using a first comparator and comparing the sloped time varying signal with the second reference voltage using a second comparator;
   generating a second calibration pulse by comparing the sloped time varying signal with the first reference voltage using the second comparator, and comparing the sloped time varying signal with the second reference voltage using the first comparator; and
   averaging at least the first calibration pulse and the second calibration pulse to determine the calibration pulse width in order to cancel mismatches of the first comparator and the second comparator.

7. The method of claim 1, further comprising:
   maintaining the slope of the sloped time varying signal when the calibration pulse width is substantially equivalent to the reference time length; and
   performing measurement based on the maintained slope.

8. A measurement method using the method of claim 1 to calibrate the slope of the sloped time varying signal, the measurement method further comprising:
   generating the sloped time varying signal that varies with time to have a slope according to the calibrated slope;
   generating a measurement signal having a voltage level that varies with a physical parameter to be measured; and
   generating a measurement pulse having a first measurement edge and a second measurement edge, the first measurement edge corresponding to a first measurement time that the sloped time varying signal has the voltage level of the measurement signal, and a second measurement edge corresponding to a second measurement time that the sloped time varying signal has the second reference voltage, a width of the measurement pulse corresponding to a magnitude of the physical parameter.

9. An apparatus, comprising:
   a signal generator configured to generate a first reference voltage, a second reference voltage, and a sloped time varying signal having a voltage level that varies with time;
   a pulse generator configured to generate a calibration pulse having a first calibration edge and a second calibration edge, the first calibration edge corresponding to a first calibration time that the sloped time varying signal has the first reference voltage, and the second calibration edge corresponding to a second calibration time that the sloped time varying signal has the second reference voltage; and
   a calibration controller configured to control the signal generator to modify a parameter that governs a slope of the sloped time varying signal, such that a calibration pulse width of the calibration pulse is substantially equivalent to a reference time length.

10. The apparatus of claim 9, wherein the signal generator further comprises:
   a band-gap voltage generator configured to generate a band-gap voltage reference; and
   a scaling module configured to scale the band-gap voltage reference to generate the first reference voltage and the second reference voltage.

11. The apparatus of claim 9, wherein the signal generator further comprises:
   a capacitor; and
   a current sink having a plurality of switchable current sources, the current sink configured to provide a current to charge/discharge the capacitor to vary a voltage on the capacitor to generate the sloped time varying signal.

12. The apparatus of claim 11, wherein the calibration controller is configured to switch on/off at least one switchable current source to modify the charging/discharging current to the capacitor.

13. The apparatus of claim 9, wherein the calibration controller is configured to receive an external clock signal, and determine the reference time length based on the external clock signal.

14. The apparatus of claim 9, wherein
   the pulse generator includes a first comparator and a second comparator; and
   the calibration controller is configured to control the pulse generator to generate a first calibration pulse by comparing the sloped time varying signal with the first reference voltage using the first comparator and comparing the sloped time varying signal with the second reference voltage using the second comparator, to generate a second calibration pulse by comparing the sloped time varying signal with the first reference voltage using the second comparator and comparing the sloped time varying signal with the second reference voltage using the first comparator, and average at least the first calibration pulse and the second calibration pulse to determine the calibration pulse width in order to cancel mismatches of the first comparator and the second comparator.

15. The apparatus of claim 9, wherein the calibration controller is configured to maintain the slope of the sloped time varying signal when the calibration pulse width is equivalent to the reference time length.

16. The apparatus of claim 15, wherein
   a physical parameter measurement module is configured to generate a measurement signal having a voltage level that varies with a physical parameter for measuring;
   the signal generator is configured to generate the sloped time varying signal that varies with time according to the maintained slope; and
   the pulse generator is configured to generate a measurement pulse having a first measurement edge and a second measurement edge, the first measurement edge corresponding to a first measurement time that the sloped time varying signal has the voltage level of the measurement signal, and a second measurement edge corresponding to a second measurement time that the sloped time varying signal has the second reference voltage, a width of the measurement pulse corresponding to a magnitude of the physical parameter.

17. An apparatus, comprising:
   a signal generator configured to generate a first reference voltage, a second reference voltage, and a sloped time varying signal having a voltage level that varies with time;
   a pulse generator configured to generate a calibration pulse having a first calibration edge and a second calibration edge, the first calibration edge corresponding to a first calibration time that the sloped time varying signal has the first reference voltage, and the second calibration edge corresponding to a second calibration time that the sloped time varying signal has the second reference voltage; and
   a calibration interface configured to receive a calibration control signal that controls the signal generator in order to calibrate a slope of the sloped time varying signal, such that a calibration pulse width of the calibration pulse is substantially equivalent to a reference time length.

18. The apparatus of claim 17, wherein the signal generator further comprises:
   a band-gap voltage generator configured to generate a band-gap voltage reference; and
   a scaling module configured to scale the band-gap voltage reference to generate the first reference voltage and the second reference voltage.

19. The apparatus of claim 17, wherein the signal generator further comprises:
   a capacitor;
   a current sink having a plurality of switchable current sources, the current sink configured to provide a scalable current to charge/discharge the capacitor to vary a voltage on the capacitor to generate the sloped time varying signal.

20. The apparatus of claim 17, wherein
   a physical parameter measurement module configured to generate a measurement signal having a voltage level that varies with a physical parameter for measuring;
   the signal generator configured to generate the sloped time varying signal that varies with time according to the calibrated slope; and
   the pulse generator configured to generate a measurement pulse having a first measurement edge and a second measurement edge, the first measurement edge corresponding to a first measurement time that the sloped time varying signal has the voltage level of the measurement signal, and a second measurement edge corresponding to a second measurement time that the sloped time varying signal has the second reference voltage, a width of the measurement pulse corresponding to a magnitude of the physical parameter.

* * * * *